(12) United States Patent
Stone

(10) Patent No.: US 6,763,325 B1
(45) Date of Patent: **\*Jul. 13, 2004**

(54) HEIGHTENED REALISM FOR COMPUTER-CONTROLLED UNITS IN REAL-TIME ACTIVITY SIMULATION

(75) Inventor: Jeremy D. Stone, Bellevue, WA (US)

(73) Assignee: Microsoft Corporation, Redmond, WA (US)

( * ) Notice: Subject to any disclaimer, the term of this patent is extended or adjusted under 35 U.S.C. 154(b) by 0 days.

This patent is subject to a terminal disclaimer.

(21) Appl. No.: 09/100,792

(22) Filed: Jun. 19, 1998

(51) Int. Cl.⁷ .................................................. G06G 7/48
(52) U.S. Cl. .............................. 703/8; 703/7; 434/14; 463/31; 463/54
(58) Field of Search .................... 703/6, 7, 8, 2; 434/14, 30, 35, 37, 31; 706/905; 463/31, 54

(56) References Cited

U.S. PATENT DOCUMENTS

| | | |
|---|---|---|
| 4,463,380 A | 7/1984 | Hooks, Jr. |
| 4,659,313 A | 4/1987 | Kuster et al. |
| 4,713,007 A | 12/1987 | Alban |
| 4,868,755 A | 9/1989 | McNulty et al. |
| 5,017,141 A | 5/1991 | Relf et al. |
| 5,083,800 A * | 1/1992 | Lockton ............... 463/42 |
| 5,240,416 A | 8/1993 | Bennington |
| 5,272,652 A | 12/1993 | Rosenheim et al. |
| 5,435,725 A | 7/1995 | Ikeuchi |
| 5,490,783 A | 2/1996 | Stephens et al. |
| 5,577,960 A * | 11/1996 | Sasaki ................. 463/31 |
| 5,616,030 A | 4/1997 | Watson |
| 5,632,622 A | 5/1997 | Bothwell |
| 5,689,682 A | 11/1997 | Peasley et al. |
| 5,727,188 A | 3/1998 | Hayes |
| 5,803,738 A | 9/1998 | Latham |
| 5,807,109 A | 9/1998 | Tzidon et al. |
| 5,823,779 A | 10/1998 | Muehle et al. |

(List continued on next page.)

OTHER PUBLICATIONS

McManus, J. W., "A Concurrent Distributed System for Aircraft Tactical Decision Generation", Proceedings of the IEEE/AIAA/NASA Digital Avionics Systems Conference 1990, p. 505–512, Oct. 1990.*

(List continued on next page.)

Primary Examiner—Russell Frejd
(74) Attorney, Agent, or Firm—Banner & Witcoff, Ltd.

(57) ABSTRACT

Enhanced realism of a real-time simulator having multiple computer-controlled units results from making the units capable of reacting to only those other units that each of them can be aware of because of their spatial relationships to the unit. Awareness is based upon probabilities; it can persist after a relationship changes; and it can be influenced by a unit's designation of a target. Each unit selects a target based upon a score incorporating multiple aspects of its tactical situation, and can change targets when the situation changes. A unit selects a strategy in response to which of a set of tactical configurations exist between the unit and its target; the strategy can change short of completion when the configuration changes. A plan produces guidance commands from the high-level strategy. The guidance commands are converted into control settings for guiding the subject unit using a physics engine for simulating the physical dynamics of the unit. The control settings can interact with each other under certain conditions. The time rate at which each computer-controlled unit performs the above operations varies with the tactical situation, and can be different for different units. The operator for each unit precomputes some data required for multiple calculations in performing the operations.

36 Claims, 8 Drawing Sheets

U.S. PATENT DOCUMENTS

| | | | | |
|---|---|---|---|---|
| 5,823,780 A | | 10/1998 | Arye et al. | |
| 5,885,156 A | * | 3/1999 | Toyohara et al. | 463/44 |
| 5,887,143 A | * | 3/1999 | Saito et al. | 709/248 |
| 5,890,963 A | * | 4/1999 | Yen | 463/42 |
| 5,890,964 A | * | 4/1999 | Aoki et al. | 463/31 |
| 6,050,823 A | | 4/2000 | McClintic | |
| 6,053,737 A | | 4/2000 | Babbitt et al. | |
| 6,077,077 A | | 6/2000 | Geipe | |
| 6,110,215 A | | 8/2000 | Stone | |
| 6,179,618 B1 | | 1/2001 | Stone | |
| 6,195,626 B1 | | 2/2001 | Stone | |
| 6,199,030 B1 | | 3/2001 | Stone | |
| 6,443,733 B1 | | 9/2002 | Stone | |

OTHER PUBLICATIONS

Trias et al., "Decision Networks for Integrating the Behaviors of Virtual Agents and Avatars", Proceedings of the IEEE 1996 Virtual Reality Annual International Symposium, pp. 156–162, Apr. 1996.*

Macedonia et al. "Exploiting Reality with Multicast Groups", IEEE Computer Graphics and Applications, vol. 15, Issue 5, pp 38–45, Sep. 1995.*

Estavnik, S., "Artifical Intelligence in Wargames", AI Expert, vol. 9, Issue 5, May 1994, pp. 23–31.*

Blumberg et al., "Multi–level Direction of Autonomous Creatures for Real–Time Environments", Proceedings ACM SIGGRAP'95, pp. 47–54, 1995.*

Bell et al., "Training Utility of Mulitship Ari Combat Simulation", Proc. Winter Simulation Conference, 1993, pp. 1036–1042.*

Coradeschi et al, "Accounting for Temporal Evolutions in Highly Reactive Decision Making", Proc. Fifth International Workshop on Temporal Representation and Reasoning, 1998, pp. 3–10, May 1998.*

Noser et al., "Navigation for Digital Actors Based on Synthetic Vision. Memory, and Learning", Computers & Graphics, vol. 19, No. 1, pp. 7–19. Jan. 1995.*

Brogan et al., "Group Behavior for Systems with Significant Dynamics", IEEE/RSJ Inter. Conf. on Intelligent Robots and Systems, vol. 3, pp. 528–534, Aug. 1995.*

Brogan et al., "Dynamically Simulated Characters in Virtual Environments", IEEE Computer Graphics and Applications, vol. 18, Issue 5, pp. 58–69, Oct. 1998.*

Musse et al., "Crowd Modelling in Collaborative Virtual Environments", Proceedings of the ACM Symp. on Virtual Reality Software and Technology, pp. 115–123, Nov. 1998.*

Hall et al, "An Air–to–Air Situationally Interactive Combat Model (SICM)", Proceedings of the IEEE 1994 National Aerospace and Electronics Conference, vol. 2, pp. 960–967, May 1994.

Lazarus, E., "The Application of Value–Driven Decision–Making in Air Combat Simulation", IEEE International Conference on Systems, Man and Cybernatics, 1997—Computational Cybernetics and Simulation, vol. 3, pp. 2302–2307, Oct. 1997.

Nash, D.A., et al., "Autonomous Conduct of Indirect Fire in Interactive Simulations", IEEE Publications, 0–7803–4053–Jan. 1997, 2596–2600, (1997).

Stevenson et al., "Real Time Aircraft Simulation using J–MASS", Proceedings of the IEEE 1995 National Aerospace and Electronics Conference, vol. 2, pp. 766–771, May 1995.

VEDA Corp Modelling & Simulation Applications Flyer from internet www/veda.com/model.htm.

* cited by examiner

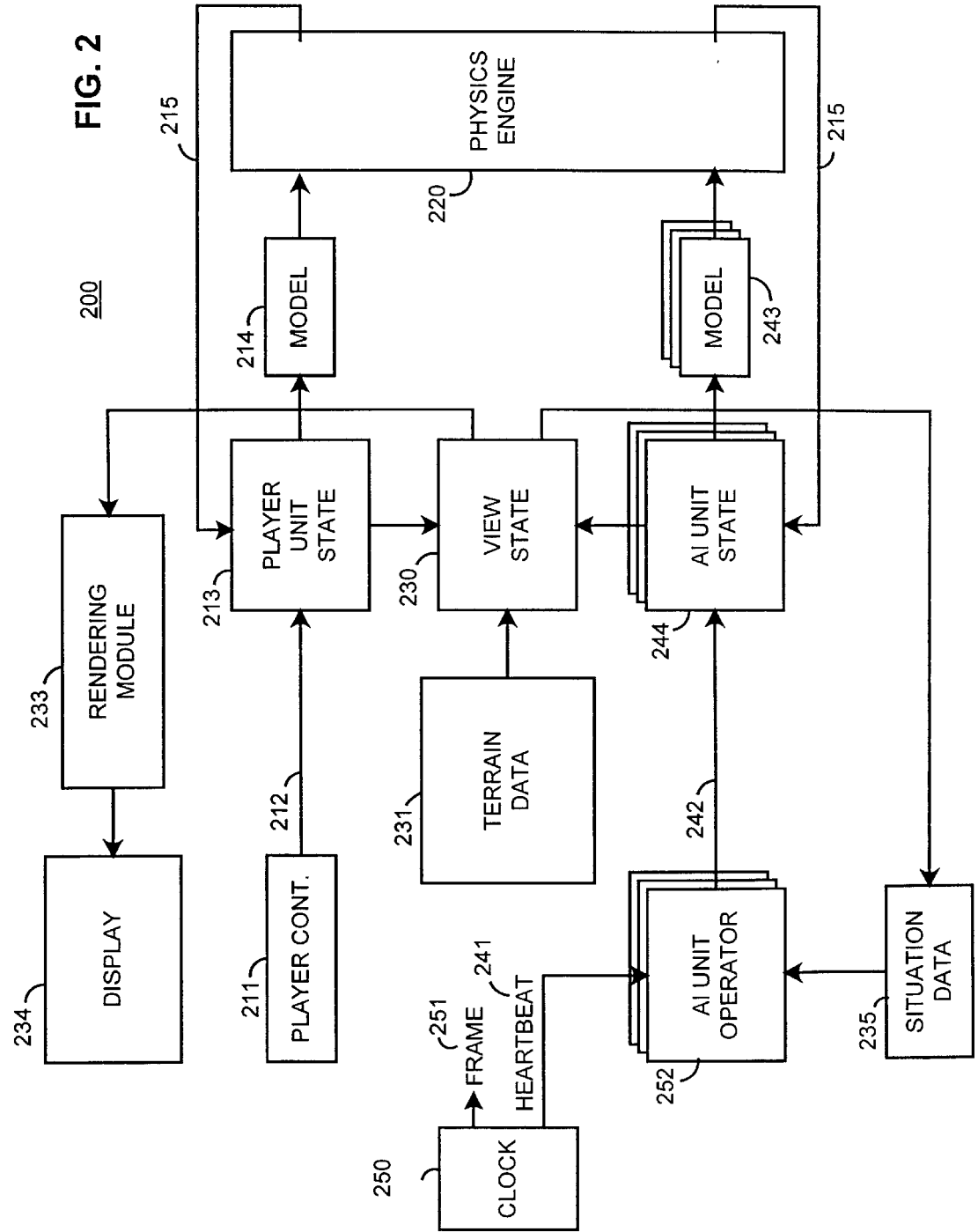

HEIGHTENED REALISM FOR COMPUTER-CONTROLLED UNITS IN REAL-TIME ACTIVITY SIMULATION

CROSS-REFERENCE TO RELATED APPLICATIONS

This application is related to U.S. application Ser. Nos. 09/099,573, filed Jun. 19, 1998 (now U.S. Pat. No. 6,110,215), entitled "Heightened Realism for Computer-Controlled Units in Real-Time Activity Simulation"; Ser. No. 09/099,923, filed Jun. 19, 1998 (now U.S. Pat. No. 6,195,626), entitled "Heightened Realism for Computer-Controlled Units in Real-Time Activity Simulation"; Ser. No. 09/100,694, filed Jun. 19, 1998 (now U.S. Pat. No. 6,443,733), entitled "Heightened Realism for Computer-Controlled Units in Real-Time Activity Simulation"; Ser. No. 09/099,703, filed Jun. 19, 1998 (now U.S. Pat. No. 6,199,030), entitled "Heightened Realism for Computer-Controlled Units in Real-Time Activity Simulation"; and Ser. No. 09/100,502, filed Jun. 19, 1998 (now U.S. Pat. No. 6,179,618), entitled "Heightened Realism for Computer-Controlled Units in Real-Time Activity Simulation".

BACKGROUND OF THE INVENTION

The present invention relates to electronic data processing, and more particularly concerns the real-time simulation of skill-based activities such as air-to-air combat.

Designing a real-time air-combat simulator is full of challenges. One of them is developing a compelling artificial intelligence (AI) for allowing the computer to control the actions of simulated aircraft and other entities that try to shoot the human player out of the sky. (For brevity, all such entities will be referred to as "AI units.")

Real-time simulators demand the utmost from a computer. There is never enough time to perform all the calculations required to simulate the motions of the player's aircraft, other aircraft visible to the player, and complex terrain, and to render their images on a display screen. Where compromises are necessary, conventional simulators tend to skimp on the realism of the AI units. The purpose of the AI units is to mimic human-like behavior as closely as possible. Playing present air-combat products quickly reveals weaknesses in the behavior of simulated enemy pilots. They feel computerish. They perform in ways which are both better and worse than human pilots. Their incredible ability to react to aircraft dead astern of them and to maneuver instantaneously is frustrating to players. On the other hand, human players quickly learn to take advantage of their simplistic tactics, turning the game into a turkey shoot.

Conventional AI-unit simulators lack realism in the area of situational awareness, the ability to see and thus react to other units in the simulated region. The common expedient in air combat is to maintain a list of the three-dimensional position of every aircraft in the combat zone, and to make the full list available to every AI unit for target selection, attack planning, and evasive maneuvers. This approach lends a disconcerting omniscience to their ability to track large numbers of other aircraft in furballs, where many aircraft engage each other from various attitudes. Real pilots can see any aircraft in a cone ahead of them, but awareness drops off for aircraft approaching from the flank or from above and below. Bogeys at six o'clock should be as invisible to AI units as they are to human pilots. Another aspect of situational awareness concerns persistence. Even though another aircraft is less visible out of the forward cone, human pilots remain aware of other aircraft that drop astern from a sector of higher visibility, and continue to react to their presence for some period of time. Further, it is characteristic of human pilots to fixate upon a targeted aircraft, paying more attention to it and paying less attention to other aircraft. It should be easier for the human player to jump a simulated enemy unit when it is pursuing another target. It should be harder for the human player to duck a pursuing enemy AI unit.

Target selection is also a shortcoming of conventional simulators. When many targets are available in a furball, present-day AI units employ crude or even random factors for designating one of them to engage. And, once locked on to a specific target, contemporary AI units doggedly pursue it, refusing to acquire a more favorable target. This defect often allows human players to consider otherwise suicidal tactics to approach an enemy unit within point-blank firing range.

A shortcoming in the basic design of simulators for many-unit simulators is to enhance the realism of the player-controlled aircraft or other unit at the expense of the computer-controlled units. For example, each AI unit might be allocated the same fixed amount of computer resources, or all AI units given exactly the same skill level. Where many computer-controlled units are attempted, it is easy to justify skimping on the physics of their simulation. Whereas the player's unit is simulated with a full physics engine that mimics many details of the unit's actual response to their control inputs, the AI units are guided through simpler simulation techniques, usually through more or less direct control of their flight paths. The player's unit gets the full treatment; the AI units do not, and suffer for it.

Enhancing the realism of computer-controlled AI units is not straightforward. The first problem is, of course, is to design their behaviors to be more realistic, as discussed above. Then, given the, computation-intensive nature of real-time simulation, the next problem is to implement those behaviors more efficiently. Simulators operate in cycles, updating the current state of objects in the system during each cycle to produce a new state for the next cycle. Conventionally, the parameters of the AI units are recalculated in a think interval that remains constant for all parameters and that is the same for all units. In a complex simulation involving increased computation for many units, each of which can be in different circumstances, this simple scheme wastes valuable time and resources. Slowly changing parameters are updated more often than necessary, while units in the thick of the action react sluggishly for lack of timely updates.

Realism of AI units suffers further from crude simulation of their maneuvers. Newer products in this genre employ sophisticated physics engines for recreating the actual characteristics of the player's aircraft. Yet the computer-controlled units remain directed by simpler commands to proceed in a certain direction at a certain speed. This technique results in jerky, mechanical actions, and in physically impossible maneuvers. Vectoring routines can include artificial constraints such as limits on turn rates, but the results are often less than believable. Also, the direct control used in conventional simulators allows little in the way of modeling different enemy aircraft. Although the user of a player-controlled simulator such as Microsoft Flight Simulator® can choose among a wide variety of aircraft types, combat-type simulators are much more restricted. The computer-controlled AI units are either fixed or restricted to a few types having unrealistic behaviors.

Unrealistic actions are most noticeable during extreme maneuvers of an AI unit. For example, a computer-generated tactical command for an aircraft to descend sharply while in a bank may produce a totally undesired maneuver, directing the craft in a wholly different direction than that intended. Even in the absence of guidance commands, maintaining a proper pitch attitude during turning and banking is difficult. Another aspect that is generated unrealistically in current simulators concerns the way in which an AI unit turns to follow a target. Computers single-mindedly point an AI aircraft at its target as quickly as possible and follow it as closely as possible. Even relatively inexperienced players see that technique as artificial.

The above discussion focuses upon air-combat simulators as an example of the class of simulators that employ one or more units or entities controlled by the computer, as well as a simulated unit controlled by a player or other user. This genre includes other competitive scenarios such as BEM (bug-eyed monster) adventure games and NASCAR races. There is little difference between simulators for entertainment and those for skill training such as driver education. All but the simplest simulation applications have less realism than their designers wish for, and the need for enhanced realism for the computer-controlled AI units is as intense as that for the player-controlled unit.

SUMMARY OF THE INVENTION

The present invention provides systems and methods for enhancing the realism of the computer-controlled AI units of a multi-unit simulator for competitive gaming and other applications. That is, the computer-controlled units behave more like human-controlled units would in the same environment, and their simulated units perform more like the vehicles or other physical units that they model.

An individual situational awareness concept for each AI unit replaces the global awareness concept of conventional simulators. Rather than allowing all AI units to observe all other units in the simulated environment all the time, the invention maintains separate lists or records for each AI unit indicating which other units that unit can for each AI unit can react to. An awareness filter maintains the list for each unit by periodically computing relationships between that unit and the other units, and adds or drops the other units based at least partially upon the computed relationships. Additional optional factors for possible inclusion on the awareness list of a unit list are the history of past relationships of the other units, and the activity in which the subject unit itself is engaged. Situational awareness removes the apparent omniscience of the AI units that makes them appear less realistic.

In order to increase the realism of situational tactics employed by AI units, another aspect of the invention employs the computed relationships among the units in the simulated environment to select a tactical course of action, for example selecting a target to pursue. The computer periodically generates a score or other evaluation for the other units in the area from the computed relationships, then selects a course of action, such as designating one of the units as a target, based upon the situational scores of those units. To avoid becoming fixated upon a single objective, reselection of a tactical objective can occur in response to periodic recalculation of the relationships and the scores. Further, the AI units can adopt individual strategies for pursuing a target or other goal, and can change the strategies short of their goals in response to changing tactical situations.

The above and other realism improvements require ways to perform large numbers of calculations within the available cycle times of a simulator. Evaluating the awareness, targeting, and strategy relationships is especially burdensome. However, some of the more numerically intensive calculations can be precomputed and cached, rather than being recalculated each time they are needed during a cycle. In addition, the time interval between successive calculations of the simulation for certain aspects of the computer-controlled AI units can be individually varied for different ones of the AI units. A situational complexity measure is produced for the environment of each unit, and the calculation cycle or "think rate" for certain parameters is varied in response to the complexity of that particular unit at that particular moment. Accordingly, an AI unit that is closing in to fire at a target, for example, recalculates its control outputs more frequently than when it is farther away, and more frequently than another AI unit that is farther away from the action.

Another aspect of the invention simulates the computer-controlled AI units from a physics engine in the same manner that the human user's unit is simulated. Rather than employing the guidance outputs of the AI control module directly to set the position, speed, and other parameters of an image of an AI unit, a translator converts the AI operator's guidance outputs for particular desired parameters into control outputs that are fed into a physics engine of the same general type as that used to simulate the player's unit. In this manner, the AI units follow exactly the same physical laws as the player's unit. Optionally, the simulator is the same one used for the player's unit, and different kinds of AI units can be simulated merely by plugging different physical models into the simulator at different times during the simulation cycles.

Actual physical modeling of the AI units, however, further increases the computational load on the simulator to derive realistic control outputs from the simpler guidance parameters. Yet another facet of the invention employs a relatively simple method for translating the guidance parameters, but modifies these methods when an AI unit performs extreme maneuvers. One method of this kind is to modify particular control output settings during certain types of maneuver, that is, while certain states or control settings of the AI unit exist. Another method is to add one or more control inputs to the simulator beyond those available for the players to control their units. The guidance controller then engages these controls in certain tactical situations. In this way, applying more complex control methods only part of the time eases the computational load while enhancing realism.

BRIEF DESCRIPTION OF THE DRAWINGS

FIG. 2 is a block diagram of a simulator for carrying out the invention.

FIG. 4, comprising

FIG. 7, comprising

DETAILED DESCRIPTION

Figure 1:
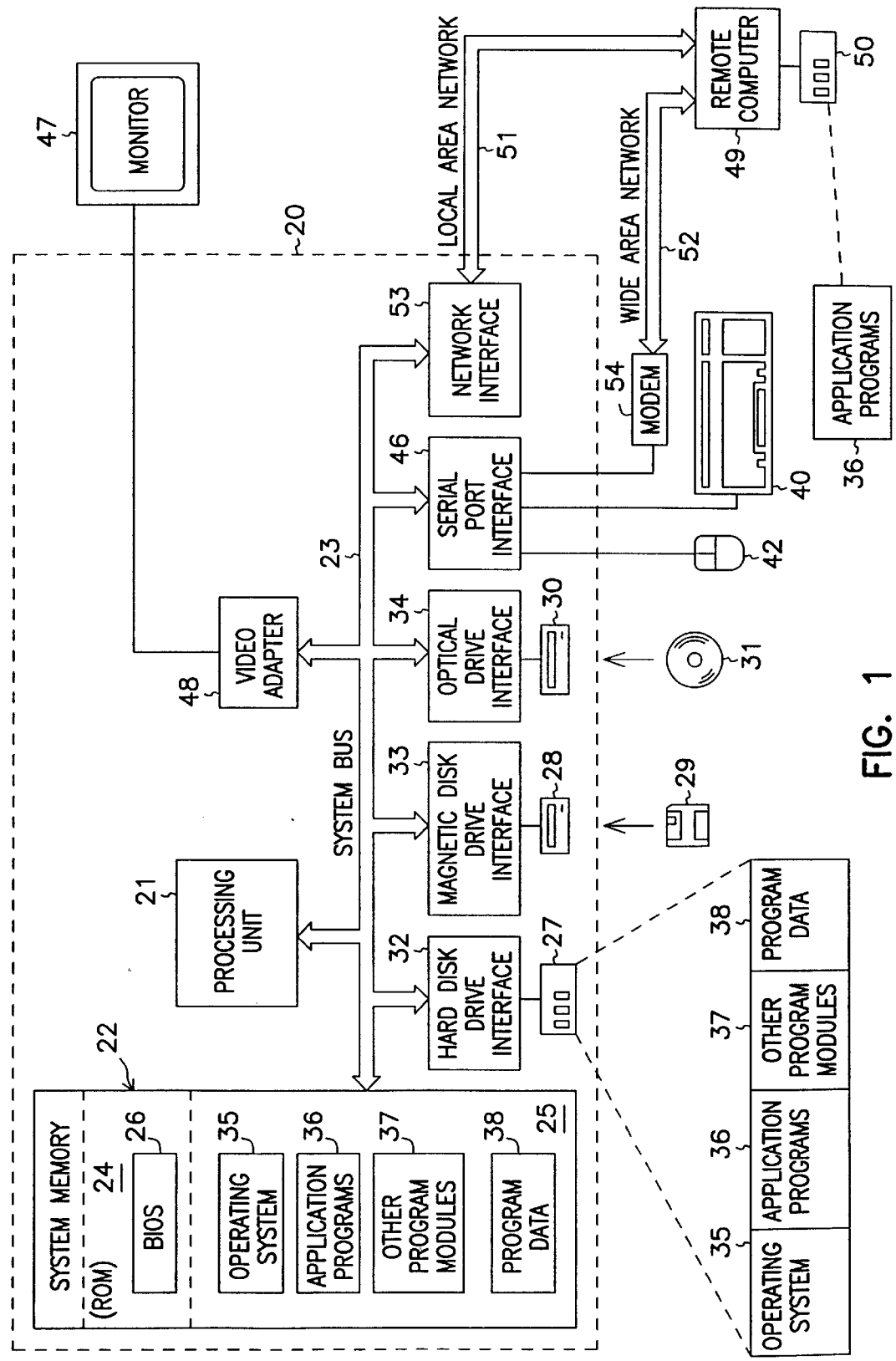
FIG. 1 is a block diagram of a computer-system environment suitable for hosting the present invention.

The following detailed description of preferred embodiments refers to the accompanying drawings that form a part hereof, and shows specific embodiments of the invention. These embodiments are illustrative, not limiting. Other embodiments, including other structures and methods, will appear to those skilled in the art. Rather, the scope of the present invention is defined only by the appended claims. In particular, those in the art will readily apprehend a wide range of applications of the inventive concepts beyond the field of air-combat simulation for entertainment and instructive purposes. The first digit of three-digit reference numerals generally indicates the drawing figure in which the numeral first appears; two-digit numbers come from FIG. 1.

Illustrative Operating Environment

FIG. 1 provides a brief, general description of a suitable computing environment in which the invention may be practiced. The invention will hereinafter be described in the general context of computer-executable instructions such as program modules executed by a personal computer (PC); however, other environments are possible. Program modules include routines, programs, objects, components, data structures, etc. that perform particular tasks or implement particular abstract data types. Those skilled in the art will appreciate that the invention may be practiced with other computer-system configurations, including hand-held devices, multiprocessor systems, microprocessor-based programmable consumer electronics, network PCS, minicomputers, mainframe computers, and the like. The invention may also be practiced in distributed computing environments where tasks are performed by remote processing devices linked through a communications network. In a distributed computing environment, program modules may be located in both local and remote memory storage devices.

An exemplary system for implementing the invention employs a general-purpose computing device in the form of a conventional personal computer 20, which includes processing unit 21, system memory 22, and system bus 23 that couples the system memory and other system components to processing unit 21. System bus 23 may be any of several types, including a memory bus or memory controller, a peripheral bus, and a local bus, and may use any of a variety of bus structures. System memory 22 includes read-only memory (ROM) 24 and random-access memory (RAM) 25. A basic input/output system (BIOS) 26, stored in ROM 24, contains the basic routines that transfer information between components of personal computer 20. BIOS 24 also contains start-up routines for the system. Personal computer 20 further includes hard disk drive 27 for reading from and writing to a hard disk (not shown), magnetic disk drive 28 for reading from and writing to a removable magnetic disk 29, and optical disk drive 30 for reading from and writing to a removable optical disk 31 such as a CD-ROM or other optical medium. Hard disk drive 27, magnetic disk drive 28, and optical disk drive 30 are connected to system bus 23 by a hard-disk drive interface 32, a magnetic-disk drive interface 33, and an optical-drive interface 34, respectively. The drives and their associated computer-readable media provide nonvolatile storage of computer-readable instructions, data structures, program modules and other data for personal computer 20. Although the exemplary environment described herein employs a hard disk, a removable magnetic disk 29 and a removable optical disk 31, those skilled in the art will appreciate that other types of computer-readable media which can store data accessible by a computer may also be used in the exemplary operating environment. Such media may include magnetic cassettes, flash-memory cards, digital versatile disks, Bernoulli cartridges, RAMs, ROMs, and the like.

Program modules may be stored on the hard disk, magnetic disk 29, optical disk 31, ROM 24 and RAM 25. Program modules may include operating system 35, one or more application programs 36, other program modules 37, and program data 38. A user may enter commands and information into personal computer 20 through input devices such as a keyboard 40 and a pointing device 42. Other input devices (not shown) may include a microphone, joystick, game pad, satellite dish, scanner, or the like. These and other input devices are often connected to the processing unit 21 through a serial-port interface 46 coupled to system bus 23; but they may be connected through other interfaces not shown in FIG. 1, such as a parallel port, a game port, or a universal serial bus (USB). A monitor 47 or other display device also connects to system bus 23 via an interface such as a video adapter 48. In addition to the monitor, personal computers typically include other peripheral output devices (not shown) such as speakers and printers.

Personal computer 20 may operate in a networked environment using logical connections to one or more remote computers such as remote computer 49. Remote computer 49 may be another personal computer, a server, a router, a network PC, a peer device, or other common network node. It typically includes many or all of the components described above in connection with personal computer 20; however, only a storage device 50 is illustrated in FIG. 1. The logical connections depicted in FIG. 1 include local-area network (LAN) 51 and a wide-area network (WAN) 52. Such networking environments are commonplace in offices, enterprise-wide computer networks, intranets and the Internet.

When placed in a LAN networking environment, PC 20 connects to local network 51 through a network interface or adapter 53. When used in a WAN networking environment such as the Internet, PC 20 typically includes modem 54 or other means for establishing communications over network 52. Modem 54 may be internal or external to PC 20, and connects to system bus 23 via serial-port interface 46. In a networked environment, program modules depicted as residing within 20 or portions thereof may be stored in remote storage device 50. Of course, the network connections shown are illustrative, and other means of establishing a communications link between the computers may be substituted.

The Simulator

FIG. 2 is a high-level diagram of a simulator 200 for carrying out the invention. The simulator is implemented as an application program 36, FIG. 1. The form of implementation is not important, however; it could also take the form of dedicated hardware or a combination of hardware and software. The following description refers to the simulated aircraft or other unit that is controlled by a human user at the computer as the "player." The computer-controlled aircraft are "AI" (artificial intelligence) units. When a description focuses upon the control of a single AI unit, that unit is called the "subject AI unit." An "opponent" is another unit, the human player or another AI unit, that is the object of attention of the subject AI unit; if the subject unit is attacking the opponent, then the opponent is a "target." The terms "friendly" and "enemy" are in relationship to the unit under discussion. (In this implementation, every AI unit knows the status of all other units, and none are unidentified. There are friendlies and bandits; there are no bogeys. Not yet.)

Simulators transform data representing a current state of the simulated units into a subsequent state according to models specifying certain characteristics of the units, rules governing actions in the simulated world, and—optionally—data concerning other objects in the simulated environment. Transformations occur in a cycle that defines an increment of real or simulated time. In simulator 200, blocks 210 represent the a conventional portion devoted to the human player. The player manipulates physical controls 211 to produce control outputs 212. Controls for an aircraft include items such as ailerons, elevators, and a throttle. Block 214 holds values of data representing the state of the player's unit for the current simulation cycle. For example, the state of an aircraft includes current bank and pitch angles, speed, flight path, and many more parameter values. Block 214 also receives the control outputs 212. Block 213 is a model comprising values for a large number of coefficients and parameters specifying the characteristics of the player's aircraft. Many simulators allow the selection of different models for the player's unit.

A simulation program or physics engine 220 implements the rules of the simulation: in this case, differential equations representing the physical laws that govern the motion of the simulated units through the air. Most simulators of this type employ difference equations to approximate the motions over discrete time intervals. That is, engine 220 receives state data from block 214 for the difference equations during the current simulation cycle. It also receives coefficient and parameter values from model 220 for specifying other parts of the equations. The physics engine plugs all this data into the equations to produce parameter values and other data representing the next time period of the simulation. This data feeds back to player-state block 214 on line 215 to update the state for the next cycle.

Block 230 integrates data for the current player state 214 with environmental data from a terrain or scenery database 231 and with data representing other units in the area. Line 232 carries data for all aspects of the simulated scene to a conventional rendering module 233, which prepares a visual image for display 234. Audio data, not shown, is usually also employed to produce engine sounds, gunfire, and so forth.

The AI units in this embodiment simulate other aircraft, both friendly and enemy, in a combat environment. AI blocks 240 include a separate operator 241, indicated by the shadowed blocks, for each AI unit within the environment. The number of these units can of course change during the simulation. The purpose of each operator 241 is to produce control-position outputs for that unit. As described more fully below, the control outputs 242 are actual settings for ailerons, elevators, and so forth, rather than simplified conventional commands such as "increase altitude" or "turn right at a 10°/second rate." Each AI aircraft or unit has a block 244 for holding its current state, and this block holds the same kinds of information that block 214 includes for the player's aircraft. That is, each block 244 contains the current values of parameters representing the status of one of the AI units for the current simulation cycle, such as current bank and pitch angles, speed, flight path, and many more. Rather than producing an abbreviated simulation through a simplified process not using physical modeling, each AI state block 244 is essentially the same as player state block 214. Each AI unit also has its own model 243, which functions in the same way as the player's model 213. This state and the model data receive the same degree of simulation as does the player's aircraft; blocks 243 and 244 employ the same physics engine as that employed for the player's unit. Physics engine 220 updates the current state of each AI unit on line 245. The player and the AI units can share the same software or hardware engine, each unit can call an instance of the engine, or the system can provide multiple engines.

The AI states are integrated into the overall view state 230, so that rendering module 233 produces an image of these units also on display 234. The human player reacts to the changing situation in response to a visually displayed scene. The AI units receive global situation data 235 representing the positions, speeds, etc. of other units in the area. However, each AI operator can only react to a subset of the global data, as explained below.

The discrete interval of time, or cycle, of the simulation is set by a clock 250. The time rate at which the states 214, 230, and 244 are updated is referred to as the frame rate 251, typically 20–30 frames per second. This rate controls physics engine 220, and usually also rendering module 233 and display 234. A player inputs new control settings at any time; the AI operator 241 reads them at the frame rate, and may effectuate them at the frame rate or at a lower rate. However, the AI operators perform some of their calculations at a different rates at different times, and at different rates for different units, as described in connection with FIG. 3.

Figure 3:
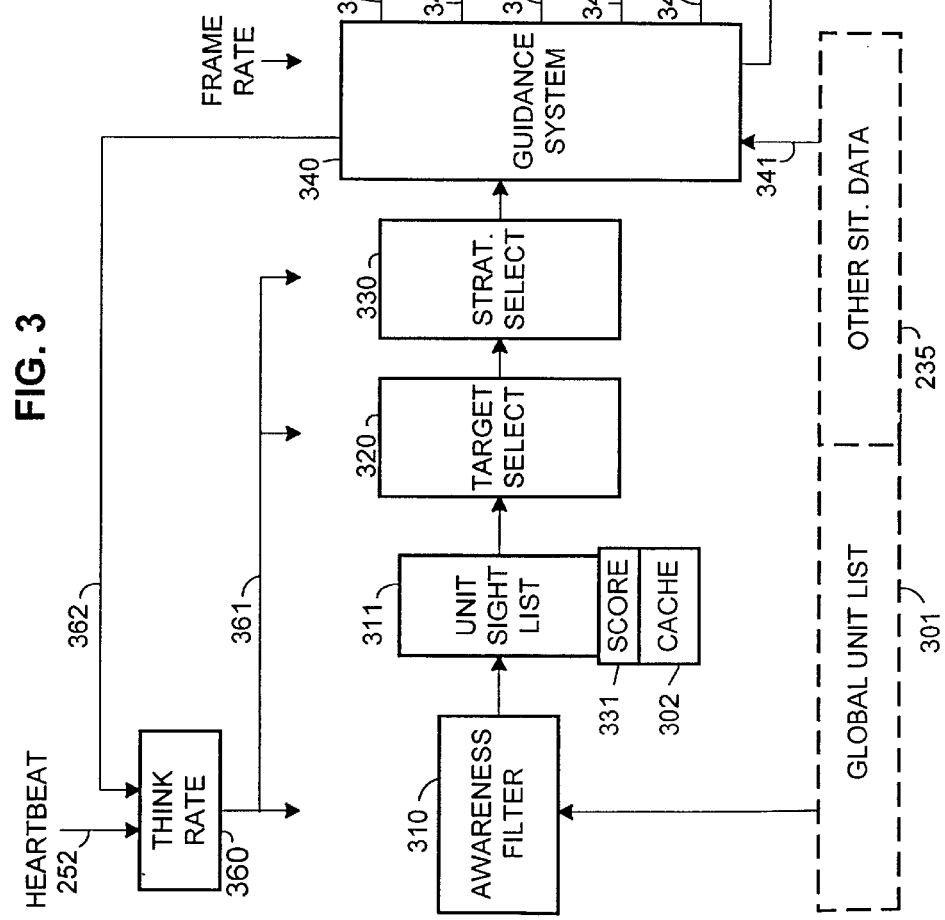
FIG. 3 is a flowchart of the overall operation of the simulator of FIG. 2.

FIG. 3 further details a representative operator 300 of the AI operators 241, FIG. 2. Situational data 235 maintains a global unit list or other record 301 of the coordinates and other information for all units in the simulated world, both the player's aircraft and all the AI units. Each unit has a separate entry in list 301. The operator for each AI unit includes a separate awareness filter 310 that passes the coordinates of only some of the other units to a unit sight list or other form of record 311 for the AI unit that operator 300 manages. Unit sight list 311 has a separate entry for each unit that the subject AI is aware of (and thus can react to). Each entry contains the position of the unit and other information taken from its entry in the global unit list. Each unit sight list entry also includes other tactical information, as described below.

Target selector block 320 can designate the player's aircraft or one of the other AI aircraft as a target to be pursued, based upon their information in unit sight list 311. That is, each AI unit chooses a target only from among the other aircraft that it is aware of, namely those on its own sight list 311. A tactical condition score 322 determines which other unit will be designated as a target.

Strategy selector 321 maneuvers the AI unit to react to the selection of a target. Selector 321 may also respond to other situational data from global list 235, such as how close the attacking AI unit is to the ground, and whether any friendly units are in its line of fire. Strategy selector chooses among a set of possible overall strategies using a stored table or list 323 as discussed in connection with FIG. 5.

Control modules 330–360 respond to the foregoing blocks to direct the path of the subject AI unit in response to the selection of a target and a strategy with respect to that target.

Plan generator 330 formulates a plan for carrying out the selected strategy, from which guidance module 340 produces a stream of high-level guidance commands for executing the selected strategy. The commands are grouped as follows:

(A) Aileron commands
   (1) Desired heading,
   (2) Desired bank angle,
   (3) Desired roll rate.
(B) Elevator commands
   (1) Desired altitude,
   (2) Desired pitch angle,
   (3) Desired pitch rate, (C) Throttle commands
  (1) Desired airspeed,
  (2) Desired throttle percentage.

At each think time, block 340 calculates and issues one guidance command from the aileron group and one from the elevator group; it optionally also issues one command from the throttle group. For example, block 340 can calculate and issue "Heading 090°" and "Pitch up12°/second" commands at the same time, but it cannot issue "Heading 090°" and "Bank right 60°" at the same time. New guidance commands from block 340 override previously issued commands.

Guidance system 340 receives the guidance commands for that AI unit, and converts them to low-level control-surface commands 342–346 of the same type that a human player might input to player controls 211, FIG. 2. These outputs do not, however, directly control the positions of the control surfaces. Instead, a translator 350 converts the command outputs 342–345 into settings 351–354 for each of the controls of a real aircraft of the type specified by model 243, FIG. 2. Converter 350 includes proportional integral/derivative (PID) controllers of a conventional type for each control of the simulated AI aircraft. That is, aileron PID controller 355 converts a command 342 to turn or bank the AI unit into a changing aileron position 351 according to the physics of the AI unit. Other PID controllers 356–358 perform the same function for other standard aircraft controls, such as elevators, rudder, and throttle. For different types of simulated units, such as helicopters, race cars, and so forth, the number of types of controls will differ.

Each controller 355–358 produces an output setting 351–354 for its own control surface position without regard to the state of the other controls. A human pilot, however, manipulates the controls as a set. The state of one control, and/or the aircraft's reaction to that state, frequently influences the setting of a different control. A turning aircraft, for example, needs back pressure on the stick to maintain altitude during a turn; the water speed of a boat can have a large effect upon the rudder angle required for a turn. Accordingly, modifier 360 forms a part of converter 350. Each of the final control positions 361–363 for the ailerons, elevators, and rudder are determined by the unmodified intermediate settings 351–353 of any or all of these controls, as well as by other inputs such as 364. Inputs 364 may represent functions of the raw control settings 342–344, previous settings of the controls, or any other parameters. Modifier 360 can act upon settings 351–353 continuously, or only at certain times or under certain conditions. Several examples of particular modifications are discussed hereinafter.

Think-rate module 370 receives the system frame rate time-interval signal 252, and determines the rate 351 at which operator 300 performs some of its calculations. That is, certain conditions of the environment of that AI unit, as determined by strategy selector 321, may cause think-rate generator 370 to output a think-rate signal 371 varying from the system frame rate (as high as 30 per second) down to once every second or less. In this embodiment, AI units think once per second under normal circumstances, increasing to three times per second and to the frame rate under certain conditions. Awareness filter 310 operates at a fixed 4-second interval, although it too could run at a variable rate if desired.

Situational Awareness

One of the hardest tasks of air combat is to see the enemy. Situational awareness is the knowledge of the position and actions of other aircraft. Giving the computer-controlled AI aircraft units the same type of situational awareness as a human pilot greatly enhances the realism of a simulation.

Figure 4B:
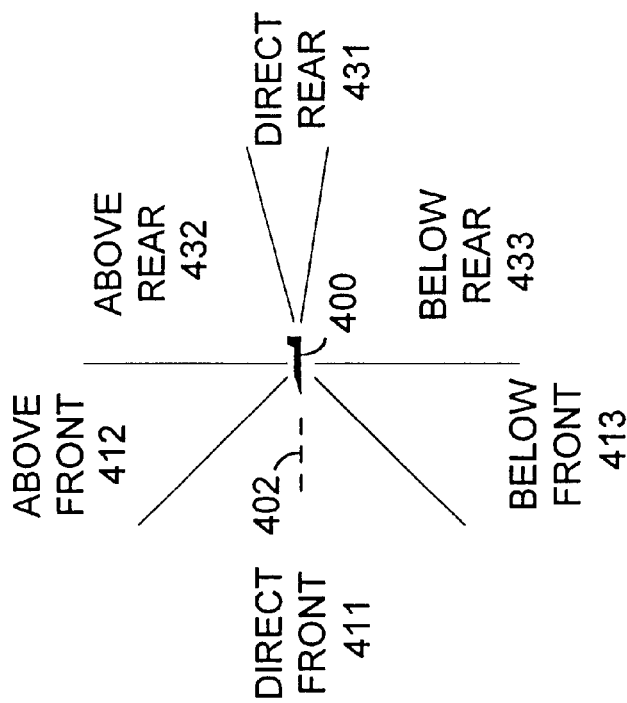
FIGS. 4A–4B, is a situational diagram of multiple simulated objects.
Figure 4A:
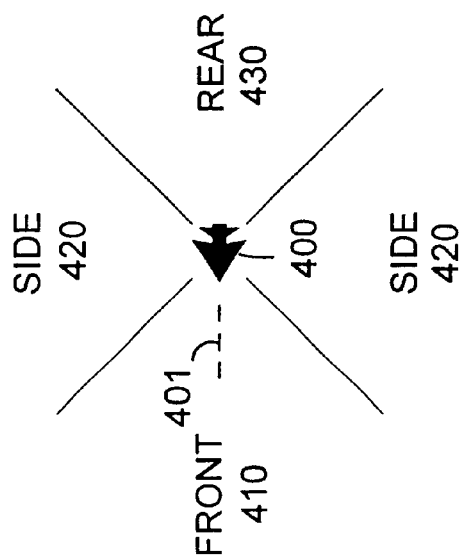

A human pilot can easily spot another aircraft in front. It is more difficult to see a plane to the side, above, or below. It is almost impossible to spot a plane in a tail-chase position. Therefore, the volume around each AI unit is divided into sectors. FIG. 4A shows a top view of four sectors around the AI unit 400, in terms of the angle off its nose (AON) 401. Front sector 410 extends from AON=0° to ±45° off the nose. Side sectors 420 extend from ±45° to ±135°. Rear sector 430 occupies remaining quadrant. FIG. 4B shows the sectors in elevation. Side sectors 420 extend from an angle of elevation AOE=0° with respect to aircraft 400 to ±90°; that is from directly above the unit to directly below it. Front sector 410, however, is divided into three pieces. A direct-front sector 411 extending from AOE=0° to 45° above and below the nose. An above-front sector 412 runs from AOE=+45° to +90°, and a below-front sector 413 runs from −45° to −90°. Rear sector 430 is divided similarly. Direct-rear sector 431 extends from 15° below the nose to 30° above. Above-rear sector 432 runs from AOE=+30° to directly overhead, and below-rear sector 433 runs from −15° to −90°. Table I below summarizes the locations of the eight sectors in terms of horizontal directions (AON) and vertical directions (AOE).

TABLE I

| AON | AOE | Sector |
| --- | --- | --- |
| −45 to +45 | −45 to +45 | Direct Front |
| −45 to +45 | +45 to +90 | Above Front |
| −45 to +45 | −90 to −45 | Below Front |
| +45 to +135 | Any | Side |
| +135 to +225 | −15 to +30 | Direct Rear |
| +135 to +225 | +30 to +90 | Above Rear |
| +135 to +225 | −90 to −15 | Below Rear |
| −45 to −135 | Any | Side |

In this example, the maximum visual range is 8 km from each unit; that is, each AI unit cannot see another unit, human or AI, farther away than 8 km, regardless of its sector.

The sector location determines whether a given AI unit sees another unit or not. If an AI unit sees another unit, its unit sight list 311, FIG. 3, contains that other unit's position, altitude, speed, heading, and other properties, such as identity. The way in which the AI unit becomes aware of other units is through a probability table. Table II below is an example of such a probability. The player can specify each AI unit separately into one of a number of skill categories. Thus, for example, a rookie AI unit always sees another aircraft in its direct-front sector, that is, with probability 100%. For other units in its above-front sector, the probability drops to 70%, and only 1% of other units in the direct-rear and below-rear sectors are seen. The probability values fall off quickly as units move toward the rear, and they fall off much more quickly for lower skill levels.

TABLE II

| Sector | Rookie | Beginner | Intermed. | Veteran | Ace |
| --- | --- | --- | --- | --- | --- |
| Direct Front | 100 | 100 | 100 | 100 | 100 |
| Above Front | 70 | 75 | 80 | 85 | 90 |
| Side | 70 | 75 | 80 | 85 | 90 |
| Below Front | 60 | 65 | 70 | 75 | 80 |
| Above Rear | 2 | 5 | 10 | 20 | 25 |
| Direct Rear | 1 | 2 | 5 | 10 | 20 |
| Below Rear | 1 | 1 | 5 | 10 | 10 |

The values in Table II are not absolute probabilities that an AI unit will see or not see another unit during the period the other unit spends in a given sector. In real life, the more time a unit spends in any sector, the more likely it is to be spotted. Accordingly, the table values are applied once during every time interval that the AI unit's tactics are reevaluated. This time, derived from the heartbeat interval 351, FIG. 3, is called the sighting-round interval. Therefore, if a detection probability is 10%, there is a 10% chance that an AI unit will spot another unit when it enters the sector. After the next sighting round, the cumulative sighting probability rises to 19%; after the third round, it becomes 27%, then 34%, and so forth.

Table II contains relative values, not absolute probabilities. For example, the table implies that rookies are 50 to 100 times less likely to see aircraft behind them than those in front of them, and that aces are ten times as likely to see other aircraft directly behind them than are rookies. Converting these relative numbers to realistic probable perception times requires a calibration factor. One way to achieve this is to choose a time duration for which an AI unit of a given skill level would have a 50% probability of spotting another aircraft in a certain sector, and then to adjust the sighting percentage to yield the desired average detection time. The calibration factor is then applied to all the percentages in table 450 to produce an absolute probability for each sector. Its value CF, which can if desired be built into the simulator, is $CF = K \times (SR/AI) \times TP$, where SR is the sighting-round interval, AT is the estimated average time to detect an aircraft in a specified sector, and TP is the table percentage for the same sector. The constant $K=0.6$ is a value used in place of the desired 50% probability, in order to simplify calculations. (That is, for small calibration probabilities, it is much easier to merely add successive probabilities of success and warp the desired 50% probability to 60%, than to calculate the actual nonlinear increases for each round. This approximation fails for larger percentages, but those cross the threshold quickly no matter how they are calculated.) Using a calibration factor to convert relative probabilities to absolute values in this way makes the average detection time independent of the magnitude of the sighting-round interval. The sighting-round interval can then vary without requiring table 450 to be reprogrammed. In addition, the system can vary the sighting-round interval for each AI unit independently of the others, and for the same AI unit at different times, as described later.

It might be desirable in some cases to employ sectors other than those described above, or to employ factors other than, or in addition to, relative angle from the AI unit. For example, increasing range could gradually lower the probability within each sector, rather than merely cutting off visibility abruptly at a maximum range. External factors such as sun direction or cloud cover could play a role in awareness. Detection of other units is not the whole of situational awareness. Another way to increase the realism of an AI unit is to introduce persistence of awareness once another unit is detected. Human pilots remember a once visible aircraft that drops behind their tail. They continue to take evasive action, even though the aircraft is no longer visible. This persistence fades, however; half a minute later the other unit could be almost anywhere.

Simulating persistence of awareness involves retaining the visibility of a detected unit for a certain persistence interval, such as 24 seconds. During that time, the AI unit continues to know the properties (position, speed, etc.) of the detected unit. But, when the once-detected unit has not been sighted for a certain time, the AI unit forgets the presence of the other unit; it drops off the unit sight list. The AI unit can detect the other unit again, in which case a new timestamp on its unit sight list starts another 24-second interval. In the meantime, however, the other unit might have dropped to a less favorable sector, making reacquisition less likely. Although retaining full knowledge of all the properties of the other unit during the persistence interval gives more knowledge than a human pilot would have, this approximation does lead the AI unit to react in realistic ways. Even more realism could be achieved by clouding the AI's awareness. For instance, position and airspeed could be returned as a random value whose deviation increases with time since awareness was lost. This would cause the AI unit to appear to guess what the out-of-sight unit is doing and to take potentially incorrect actions, as a human pilot would do.

Human pilots also tend to fixate upon a target once they have selected it. This has the advantage of lowering the probability of losing sight of the target. On the other hand, target fixation lowers the likelihood of seeing other aircraft in unfavorable positions. Many real dogfighting kills occur when pilots are jumped from behind while concentrating on their own attack. It is convenient here to implement target fixation by increasing the probability that a designated target aircraft passes through awareness filter 310, while simultaneously decreasing the probability that the filter passes other units, human or AI. Multiplying the target probability by 1.12 and multiplying the probability of others by 0.88 achieves a realistic effect in this implementation. Line 312 indicates the dependence of these probabilities upon target selection.

Opponent Selection

A complex simulation involving multiple independently controlled units presents the problem of how to select one of them as an opponent, target, or other object of attention. At the same time, many-on-many situations are very interesting, and therefore worth a great deal of effort to provide in a simulation. The goal of a target-selection model is to arrive at a set of rules that cause a computer-controlled AI unit to choose its targets in a manner that appears realistic or human. Some of these rules can be mutually contradictory. This too adds realism; in air-combat simulations, high-density furball situations frequently produce anomalous behavior. In this discussion, the terms "target" and "opponent" are used interchangeably to denote the other unit that an AI unit reacts to at the moment. Although this reaction is usually to pursue the other unit, the subject unit may choose to flee, if it should come under attack.

Every simulation application has a different group of heuristic guides, principles, or other considerations, usually gathered from real-life experience. For the air-combat simulation under discussion, the list below distills a few of the broader principles followed by good human fighter pilots.

(1) Choose a target so that the attacking aircraft has a tactical advantage, such as speed, altitude, relative position, and/or heading. Both speed and altitude represent stored energy that can be cashed in for tactical advantage; altitude can be traded for speed, and vice versa.

(2) Avoid ganging up on targets that other friendlies have already selected, because that might leave other enemy units unengaged.

(3) Prefer closer targets to those farther away.

(4) Stay with a selected target until it is destroyed, or until the tactical condition becomes unfavorable or dangerous.

(5) In the absence of appealing targets, merely cruise the area until an opportunity presents itself.

(6) Bend the rules when faced with a sudden opportunity or a lucky shot.

Again, these principles are fuzzy, and some are contradictory; but the rules should follow them in order to produce realistic behavior on the part of the AI units.

The concept of a tactical score converts the above principles into a metric that functions as an evaluation of a set of rules. The tactical score of a candidate target begins at zero, and adds or subtracts points for the following factors:

(1) ±10 points for every 300 feet of altitude above/below the candidate target unit.

(2) ±10 points for every 10 knots of speed above/below that of the candidate target.

(3) −5 points per 300 feet away from the proposed target.

(4) +100 points if the subject AI follows the target and faces it.

(5) −50 points if the target is behind the subject AI unit.

(6) −100 points if another unit has already selected that candidate as a target.

The factors include spatial relationships such as distance, bearing, and relative orientation, and also includes situational aspects such as target designations by other units. In this implementation, each AI unit is made aware of target selections by the other AI units.

The individual point assignments are arbitrary. Their relative values reflect the relative importance of factors such as those described above. Higher scores indicate that a target is more attractive than another candidate having a lower score. For example, the overall score diminishes considerably when other freindlies have decided to pursue that target; if the target is otherwise very attractive, it gains enough points to overcome the fact that teammates are already after it. The point system should be comprehensive enough to be realistic, yet simple enough to be computationally feasible. The only units for which a score is calculated are those that the subject AI unit is aware of, namely, those having entries in its unit sight list; these are the only units to which the subject unit can react.

If no candidate accumulates a score higher than a threshold value, such as −500 points, the subject AI unit loiters until a favorable potential target presents itself. The subject AI unit selects as a target the candidate having the highest tactical score. However, in order to add some unpredictability, the raw scores are randomized somewhat before being presented for final target selection.

Whenever any AI unit does not have a selected target, that unit scans all other enemy units, AI or human, that particular AI unit is aware of. As discussed above, different AI units are aware of different sets of other units; this restricts the available candidates for target status.

Once an AI unit designates one opponent as a target, strategy selector 321 and control modules 330–360 engage and pursue that target. However, target selector 320 continues to evaluate all enemy units on its unit sight list 311 as potential targets. That is, the designated target may outmaneuver the AI unit, or another unit may blunder across the AI's path and present a desirable tail shot. Realistically, target selector 320 does not change its mind to gain only a slight advantage; in this embodiment, selector 320 requires as a threshold that the new potential target have a score 150 points higher than that of a current target.

Strategy Selection

Once target selector 320 of operator 241 of an AI unit has selected another unit as an opponent, strategy selector 321 determines the optimum strategy or tactic to follow. Selection among different strategies to achieve an overall objective leads to another aspect of enhancing the realism of computer-controlled AI units in a simulator. The tactical acumen of conventional computer-controlled AI units is typically low, especially under changing circumstances. It is common to see AI units ignore a tempting human player when they have already selected another target and refuse to change tactics until that mission has been accomplished. The present simulator employs strategies, which form a set of general courses of action to follow. Each AI unit chooses a particular strategy based upon its circumstances and environment. When it has selected a strategy, it formulates a particular plan for executing that strategy. A plan is an instance of a strategy; a strategy lays out a course of action in general terms, while a plan plugs in specific parameter values for performing the strategy. For example, the strategy "head-on merge" instructs an AI unit to pass another approaching unit and attempt to gain a tail position on it. A plan for this strategy might provide detailed orders to gain 700 feet of altitude on the other unit and pass 500 feet to its right, so as to gain space for a turn into a following position. This example reveals the importance of an ability to change a plan or a strategy before its completion. If the oncoming unit, human or AI, turns away after the plan has commenced, a mindless continuation of the original plan until some fixed end condition occurs could well end in disaster for the AI unit. The challenge is to determine the correct conditions for altering or abandoning a chosen plan short of completion. That is, just as target selector 320 continues to function after target acquisition to determine whether a designated target should be abandoned, strategy selector 321 continues to monitor the tactical situation in order to determine whether a chosen strategy should be abandoned short of its ultimate goal.

A tactical condition metric determines which of a set of strategies to choose, and also determines when it is appropriate to abandon the strategy and select a new one. Although the tactical condition metric is relatively coarse, it is inexpensive to compute and to implement. The value of a tactical condition metric or score is a function of the relative angular position or orientation, and the relative heading of the AI unit with respect to a designated opponent unit.

Conceptually, the invention considers whether the opponent lies in the front, left, right, or rear quadrant of the subject AI unit. For each quadrant, the subject AI has one of four possible headings relative to the opponent: facing away, facing toward, and parallel on the right or left side. Some of the resulting sixteen tactical conditions are removed by symmetry, and a few more detailed special cases are introduced.

Figure 5:
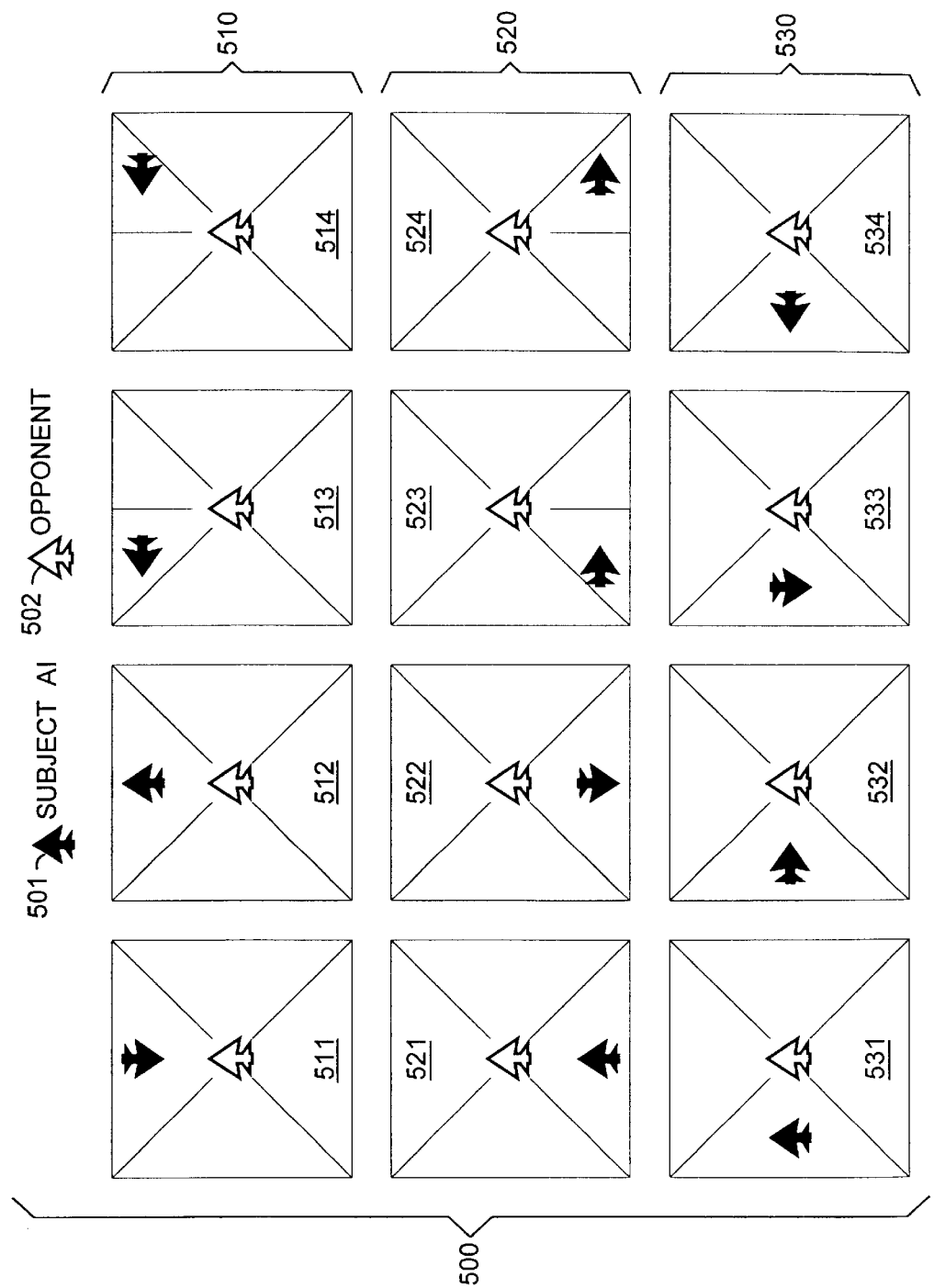
FIG. 5 describes certain tactical configurations for strategy selection according to the invention.

FIG. 5 diagrams twelve tactical configurations 500 that an AI unit employs to choose a strategy. In the views from above, a filled symbol 501 designates a subject AI unit, while open symbol 502 designates its opponent, either a human player or another AI unit. Configurations 510 place the subject AI ahead of its opponent. Configuration 511 has the two units approaching each other from the front, while 512 shows the opponent approaching from the rear. Configurations 513 and 514 divide the opponent's front quadrant into two volumes. In case 513, the subject AI unit has already crossed the nose of the opponent and is moving away from it; in case 514, the subject unit is still moving toward the opponent's nose. Configurations 520 have the subject AI unit behind its opponent. Case 521 shows the subject AI in a tail chase, moving toward its opponent, while 522 shows the subject AI moving away. Cases 523 and 524 represent stern crossings, where the subject unit is moving toward or away from the opponent. Configurations 530 position the subject AI on the opponent's flank, with the subject AI moving parallel with the opponent, toward it, parallel in an opposite direction, and away from the opponent in configurations 531–534 respectively. Each of these configurations has an equivalent mirror image about its vertical axis, and any possible directional orientation.

Table III shows the strategies programmed for an AI unit in each of the twelve configurations 500. The first column is the number of the configuration in FIG. 5. The second column is a short name of the configuration. The third column lists possible strategies for each configuration.

TABLE III

| Config | Engagement Type | Strategies |
|---|---|---|
| 511 | Head-on (Merge) | (1) Maneuver for separation. |
|  |  | (2) Perform head-on attack. |
| 512 | Under tail attack | (1) Evade. |
| 513 | Opponent approaching rear flank | (1) Disengage. |
|  |  | (2) Evade. |
|  |  | (3) Maneuver for tail position. |
| 514 | Opponent approaching front flank. | (1) Maneuver for separation. |
|  |  | (2) Perform head-on attack. |
| 521 | In tail-attack position | (1) Perform tail attack. |
| 522 | Separating behind | (1) Maneuver for tail position. |
|  |  | (2) Disengage. |
| 523 | Approaching opponent's rear flank | (1) Maneuver for tail position. |
| 524 | Separating from rear flank | (1) Disengage. |
|  |  | (2) Maneuver for tail position. |
| 531 | Flanking parallel | (1) Disengage. |
| 532 | Closing on opponent's flank | (1) Maneuver for tail position. |
| 533 | Passing on opponent's flank | (1) Maneuver for tail position. |
|  |  | (2) Disengage. |
| 534 | Separating on opponent's flank | (1) Disengage. |
|  |  | (2) Maneuver for tail position. |

For example, a head-on engagement configuration 511 can activate a maneuver for separation, intended to position the subject AI 501 in a passing flank configuration 533 and then into configuration 521 for a tail attack on the opponent. Alternatively, AI unit 501 can perform a direct head-on attack against opponent 502.

Configuration 512 has the subject AI under tail attack. This is an extremely dangerous position, and the only sensible strategy is to evade the attacker. An opponent approaching the rear flank, case 513, is less dangerous. The subject AI can choose to disengage as well as to take more extreme evasive action. This situation also presents an opportunity for a third alternative, a possible maneuver toward a tail-chase position 521. A table such as 550 can be modified easily, merely by plugging different sets of strategies into column 553.

Where multiple numbered strategies occur for a configuration, a random selection is made. If desired, however, strategy selection can be assigned or weighted according to a number of situational factors, such as distance between the aircraft, relative speed, and altitude difference, as well as remaining fuel and ammunition. For example, when the opponent is approaching the rear flank of the subject AI unit (configuration 513, FIG. 5), an altitude or speed advantage can bias the AI unit to maneuver for a tail attack, whereas a tactical disadvantage biases toward the listed evasion strategy.

Upon each change of configuration, strategy selector 321 chooses a new strategy, and plan generator 330 formulates a new plan based upon that strategy. That is, whenever the subject AI 501 crosses a boundary between one configuration 500 and another, one of the strategies listed in column 553 for the new configuration replaces the strategy for the previous configuration. This approach allows both a natural progression of tactics and a change in goal in the face of an opponent's tactics. As the AI unit follows its plan, the design of the tactical conditions and the corresponding strategies attempts to bring the subject unit to an advantageous position and eventually to a firing solution. In the head-on configuration discussed above, for instance, a separation strategy is aimed toward ultimately achieving a tail position, and the intermediate flanking configuration preserves this goal—yet recognizes the possibility that the original goal might not be the best course, and that disengaging might be preferable under the new circumstances. For instance, the opponent might maneuver to deny a head-on engagement. As soon as this maneuver produces a new configuration, the changed tactical situation causes the subject AI to choose a new, more appropriate strategy, rather than blindly continuing to a completion condition specified by the original merge strategy.

Control Interaction

The controls of a vehicle or other guidable object are generally designed to control a single aspect of its motion. Fixed-wing aircraft have ailerons, elevators, a rudder, a throttle, etc. Other vehicles have other major controls, such as the collective and pitch controls of a helicopter. To some extent, however, the major controls usually interact with each other, or produce actions that are not appropriate in certain circumstances. Many of these cases occur during extreme maneuvers of the vehicle. Although some conventional simulators provide autopilots that control flight surfaces, none of them perform competently for the range of maneuvers and attitudes commonly encountered in combat situations, and none of them will lead an aircraft through extreme situations in the course of executing a pilot's guidance instructions.

Block 360, FIG. 2, includes a number of individual modifiers that force changes in the control outputs 342–344 in response to their past settings, the present or previous settings of other controls, certain states of a simulated aircraft, and/or other circumstances. The modified settings 361–363 then form the final control outputs 242 of AI operator 300.

Human pilots quickly learn to apply back pressure to the stick or yoke while turning, in order to maintain altitude and increase turn rate. Because elevator output 352 only holds the stick back in response to a command to gain altitude, one of the modifiers 360 automatically generates a control setting for holding the stick back (or for increasing an existing stick-back setting) when aileron command 342 indicates that the AI unit is in a turn. Calculating the proper magnitude of this interaction is not straightforward, although not computationally challenging. In this embodiment, the bank rate 342 from a previous frame is subtracted from that of the current frame. The modifier then increases the setting of elevator output 352 by a constant times the absolute value of this difference, before outputting the final elevator setting 362.

Another potentially unrealistic action of a AI unit concerns an elevator command 343 to descend during a turn. Another modifier of block 360 accordingly disallows any forward-stick setting on output 362 for two of three possible circumstances during a turn. If a desired bank angle commanded by output 342 exceeds the current bank angle indicated by output 351 by a threshold amount, the AI unit is entering a turn. When the desired bank angle is about the same as the current angle, the AI craft is holding a turn. A desired bank angle less than the current value by a threshold amount is rolling out of a turn. Any elevator setting 352 indicating a descent is raised to a neutral setting for the first two of the above conditions, but not for the third. That is, the AI unit can begin a descent when rolling out of a turn, but not while entering or holding a turn.

Two further sets of circumstances concerns pitch control while banking. The principle is that pitch commands during a bank do not in fact control vertical motion, because the elevators are no longer horizontal. Also, pitch commands during a turn unintentionally control turn rate, in derogation of a turn command on output 342; down elevators kill a turn, while up elevators tighten the turn radius.

First, as the elevators lose more and more pitch effectiveness during a bank, the rudder becomes increasingly horizontal, and can produce pitch changes. An aircraft in a 90° bank can climb and dive with its rudder alone. Accordingly, a modifier function in block 360 reroutes pitch commands 343 partially to rudder output 353. For current bank angles less than 10°, no pitch setting affects the rudder output. Above 10° bank, however, the modifier adds to the rudder setting 344 a constant times the current bank angle 351 times the desired pitch setting 343, to produce modified rudder setting 353. This modification also allows the ruder interaction to decrease to zero as the AI aircraft returns to level flight. Rudder control of pitch can be overdone. Therefore, the above modifier hard-limits the total increase in rudder setting to 30% of the total settings of the Aaileron, elevator, and rudder angles 351–353.

Second, pitch can be controlled by modifying overbanking. Overbank is the difference between desired and current bank angles, and its value is stored between simulation frames. Another modifier in block 360 calculates a function of the current bank 351 and the desired bank 342 to produce an overbank correction. Then, whenever elevator output 343 requests pitch down, modifier block 360 increases aileron output 351 by the correction amount at output 361. When output 343 requests pitch up, the modifier calculates another function of the current and desired bank angles to produce a different correction. Block 360 then decreases overbank by the second correction. This correction is limited to zero overbank, however; that is, pitch corrections cannot reverse a desired bank amount.

In real air-combat operations, human pilots sometimes employ body pitch rate (BPR) control in closing on a target in a tail chase. Window 600 shows a simulation area as it would appear to a human pilot closing on an enemy 610 during a turn. The object is to move the enemy left into gunsight crosshairs 601. Because the aircraft is at a significant angle to the horizon 620, direct use of the ailerons and elevators individually move it along the axes 621 and 622 of the world coordinates. Attempting to coordinate control-surface commands 342–344 to swing the enemy almost directly left in the reference frame 602–603 of the AI aircraft produces unrealistic behavior. The AI operator 300, like a human pilot, has two degrees of freedom in directional control, and must choose two guidance instructions—one for each degree of freedom. But, because a dogfight can occur at any attitude relative to the earth, the AI unit can choose guidance instructions that execute relative to the AI's reference frame, not the earth's.

When the AI is in tail-attack strategy 521, guidance module 340 is enabled to produce BPR guidance commands 346 for moving in a synthetic axis 602 that is perpendicular to the pilot's body axis 603 within the aircraft. This command is actually a pitch-rate command, and are sent to elevator PID controller 356. It provides very fine control of the attacking unit's attitude when it is lining up on a target.

Guidance module 340 is able to specify one command from each of the groups (A)–(C) listed above. When the AI is in tail-attack mode, a BPR command can be one of the selected commands. For example, block 340 can specify during the same time interval a setting for BPR and one for bank angle, or a setting for bank angle and one for pitch up. That is, body-pitch control does not replace any other controls; it merely adds one more capability to the set of available commands, allowing more complex and realistic action than would otherwise be possible.

Computation Rates

A realistic experience in a real-time simulation depends highly upon a high enough frame rate to provide a smooth flight path and quick aircraft response for both the player's unit and the computer-controlled AI units. The calculations required for controlling an AI unit in a simulation are extensive and complex. Performing them in a straightforward manner has the potential for slowing the frame rate of the entire simulation. The move toward many-on-many simulations, having large numbers of AI units, compounds this problem.

An AI unit evaluates its tactical condition, performing its target and strategy selections, its planning, and control settings, during an evaluation interval. As discussed above, each AI unit reevaluates these parameters repeatedly in order to execute and modify its actions in a realistic manner. The resulting high computational load can be reduced by the insight that the necessity for performing at least some of the calculations varies from moment to moment with the tactical situation of each individual AI unit.

A dynamic AI evaluation interval changes the rate at which an AI thinks about what it should do during the following evaluation interval, specifically, about what commands 342–346 it should issue for the next interval. An AI unit having no currently selected target, or one that is disengaging from an opponent, can afford to free up computation time for other units by thinking only once per second. On the other hand, lining up a cannon shot on a fast-moving target requires more frequent control changes, perhaps as often as once every frame rate. Other situations, such as attempting to close on a tail position, optimize to intermediate evaluation intervals and rates.

For the present purpose and with contemporary computation speeds, a base evaluation or think interval of one second (1 Hz think rate) is convenient. Think-rate controller 370, FIG. 3, sets this rate on line 371 in the absence of any other rate command from strategy selector 331. As an AI unit enters a more demanding tactical situation, interval command 372 sets a higher rate, say 3 Hz. Thus, for example, an opponent cannot easily throw off an AI pursuer by making a tight turn, because the AI unit can adjust its own course more frequently. The most demanding; situations, such as preparing to shoot an opponent in tail attack, causes the AI unit operator to reevaluate its parameters and issue new guidance commands for every frame interval. This interval, having a typical rate of 20–30 Hz, allows the highest possible maneuverability. When the tactical situation clears somewhat, strategy selector 321 resets the evaluation interval back to a lower rate.

A number of different criteria may serve to set the think rate. In this embodiment, the criterion is simply the choice of strategy in block 321. Table IV below lists the strategies and their associated think rates. A new rate becomes effective whenever a new strategy is selected.

TABLE IV

| Selected Strategy | Think Rate |
|---|---|
| Disengage | 1 Hz |
| Evade | 1 Hz |
| Maneuver for separation | 1 Hz |
| Maneuver for tail position | 3 Hz |
| Perform head-on attack | Frame rate |
| Perform tail attack | Frame rate |

Each AI unit has its own think rate, set by its own controller 370 for its own specific tactical condition. In this way, some of the units can maneuver more quickly without exceeding the overall capacity of the host computer.

Precomputation of tactical information also offers greater computational efficiency. The calculations necessary for controlling an AI unit such as an aircraft can be divided into several different types. There are many parameters concerning units on its sight list that an AI unit must refer to frequently and/or in different parts of their control cycle. Many of these computations are expensive; for example, calculations for determining angles and distances of other units from each AI unit involve the evaluation of trigonometric, square-root, and other complex functions. Such calculations should be made only once in each think interval wherever possible.

In this implementation, the following parameters are calculated only once during each think interval for each other AI unit included in the sight list 311 of a subject AI unit:

(1) Tactical configuration 500, FIG. 5, (2) Quadrant 400, FIG. 4, (3) Distance from the subject AI unit, (4) Compass bearing from the subject AI unit, (5) Relative heading of the other unit from the subject unit.

(6) Angle off nose (AON) of the other unit from the subject unit, (7) Angle of elevation (AOE) of the other unit from the subject unit, (8) Tactical score of the other unit.

The simulator caches the results of the above computations in its unit sight list. That is, the entry for one of the other aircraft in the subject unit's sight list contains all eight of the parameter values for that aircraft, the entry for a second other aircraft includes all eight parameters for the second aircraft, and so forth. AI code in target selector 320, strategy selector 331, and any other components of operator 300 can access the cached values directly from the corresponding entry in unit sight list 311. Again, these values are refreshed once during every evaluation interval of that particular AI unit. Thus, because of the variable evaluation rate, this refresh also occurs at a variable rate.

Overall Operation

Figure 7A:
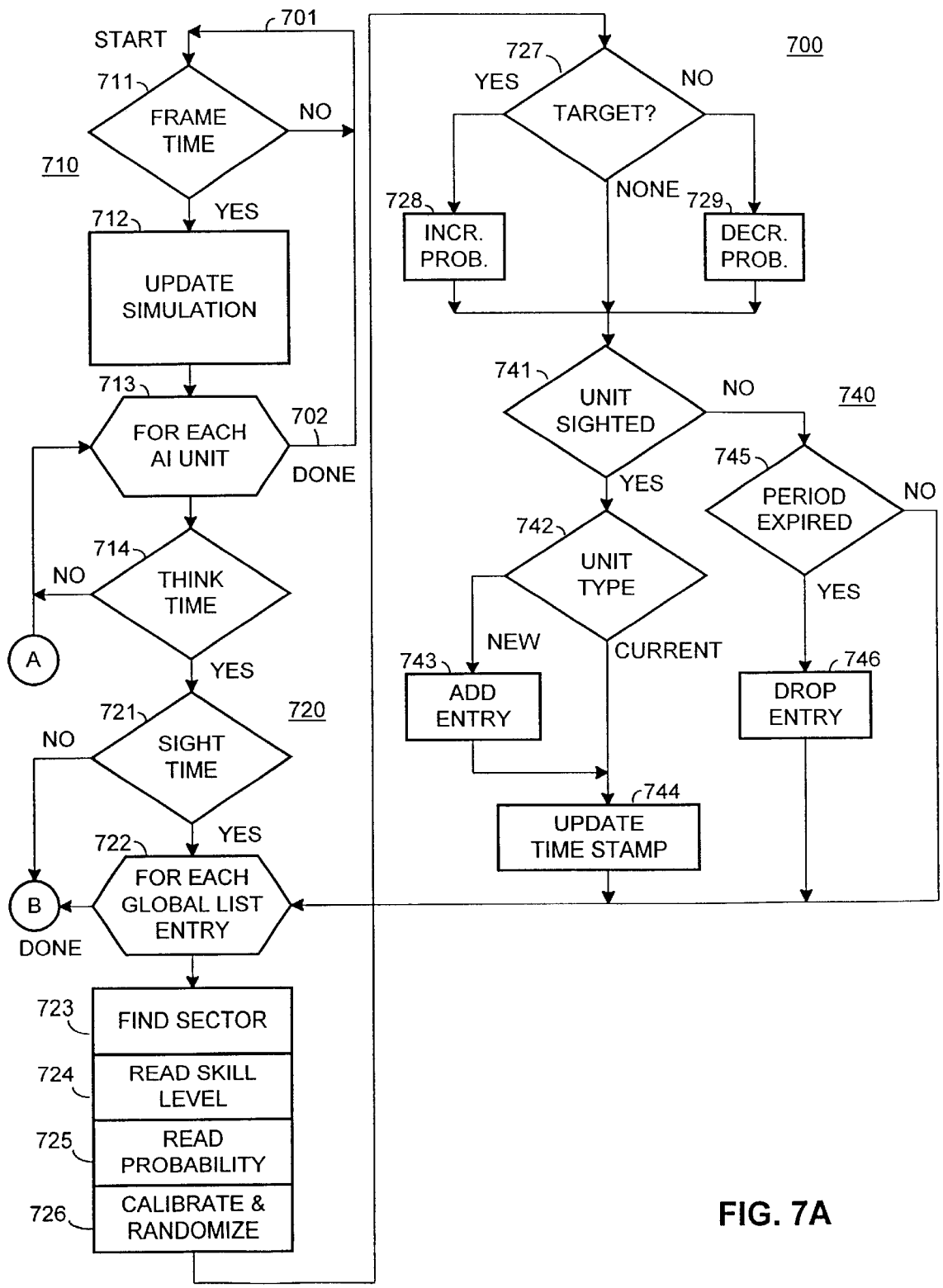
FIGS. 7A–7C, is a flowchart showing the operation of the simulator of FIG. 2 according to the invention.
Figure 7B:
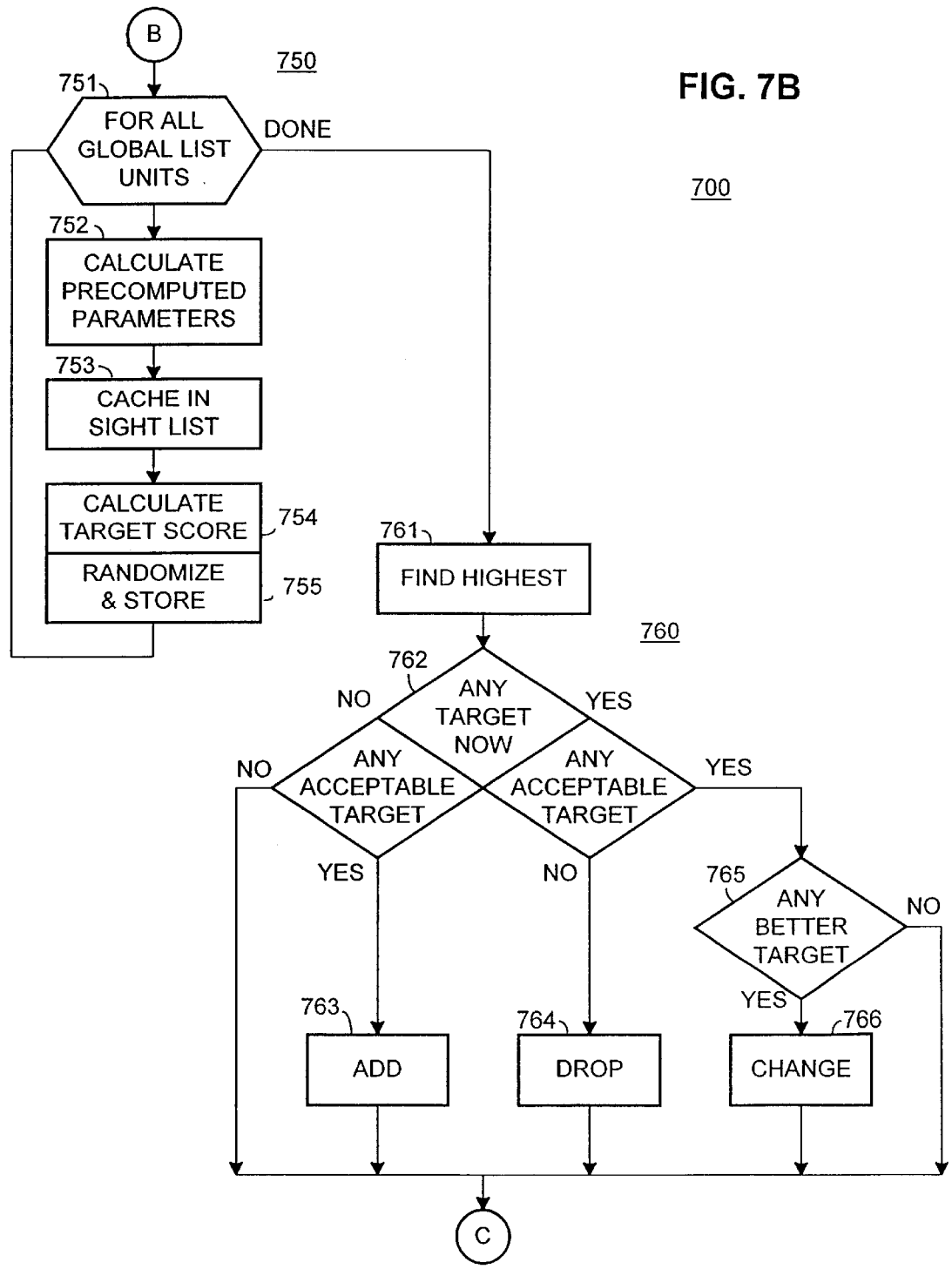
Figure 7C:
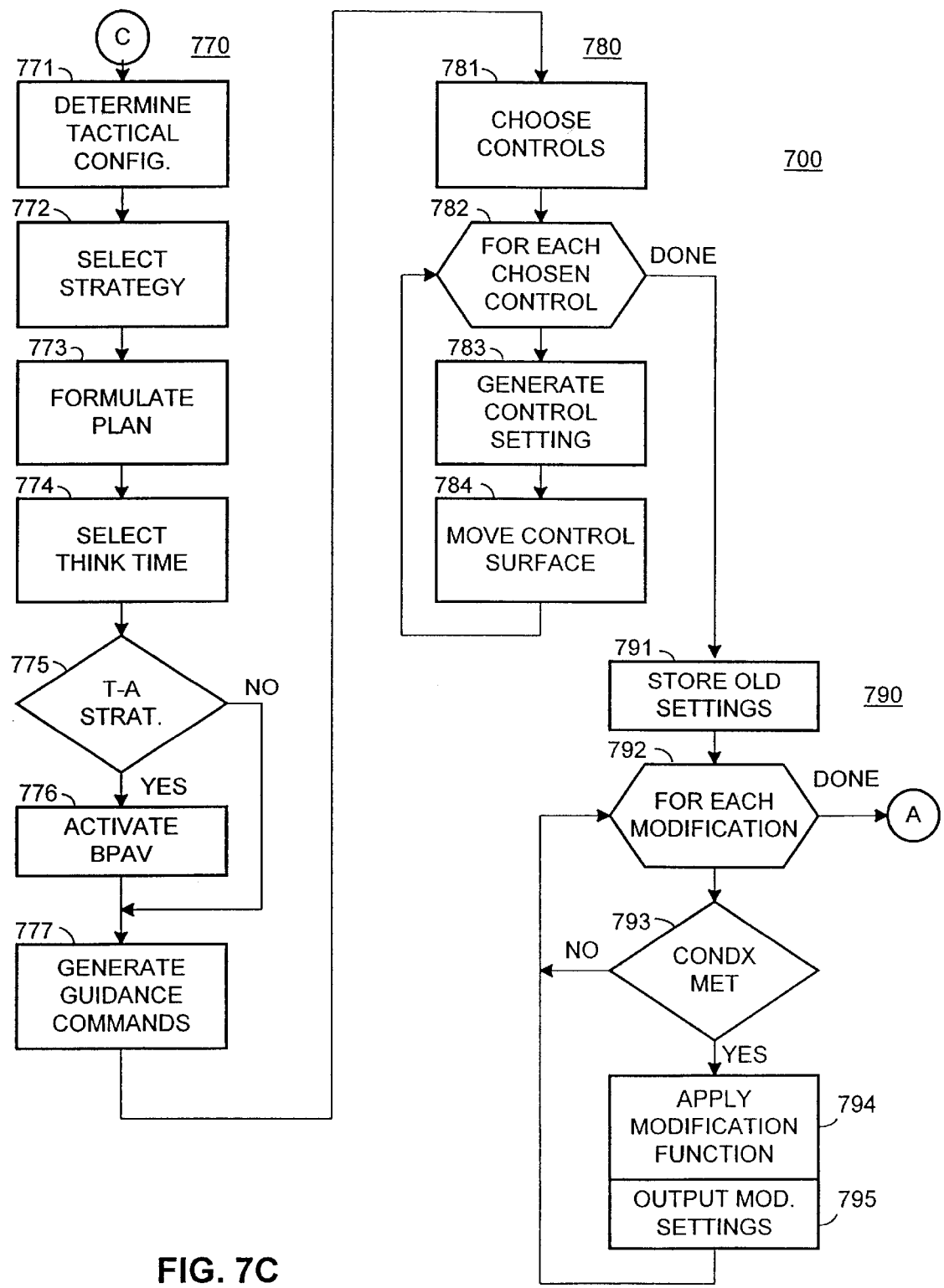

FIGS. 7A–7C comprise a flowchart showing the operation of AI unit operators 300, FIG. 3, during a complete cycle or loop 700 of simulator 200, FIG. 2. The order of the blocks does not necessarily imply a particular time sequence. In some cases, the operation requires no time sequence at all; in some other cases, the specific embodiment being described imposes a time order, but other embodiments might employ a different order. That is, loop 700 depicts the logical operation of the invention, and not its temporal operation. Likewise, the layout and numbering of the blocks are for convenience only, and do not necessarily connote a grouping or other relationship.

Starting at entry point 701, cycle 700 continues to loop by returning through completion point 702 at the end of the cycle. Blocks 710 cycle simulator 200 at its frame rate. At every frame time 251, block 711 activates block 712 to update the positions of the player's unit and all the AI units through physics engine 220 so as to produce the next state. Block 713 cycles through all of the AI operators 300, and then returns to completion point 702 of the overall loop. Although this cycle is shown within the frame-time loop, the operations in the loop controlled by block 713 are actually interleaved with the frame-rate update, so that only a portion of them occur during each frame interval. For each individual operator 300, block 714 asks whether its think interval has expired. Again, the think rate can range from 1 Hz to the frame rate, usually 20–30 Hz, and can differ for different operators. An operator that wants to think gets called; operators whose think intervals have not expired do not get called.

After an operator has been called by block 714, its first task 720 is to update the unit sight list 311 of each operator. In this embodiment, list 311 is updated only once every four seconds, regardless of the think rate; other simulators may desire to update at a different rate, or to key the list interval to the think time or to some other base. When block 721 signals expiration of the sighting interval, block 722 cycles through every other aircraft unit, human and AI, having an entry in global unit list 301. Block 723 calculates the distance and angles (AON and AOE) of each unit from the subject unit, in order to determine which of the sectors 410–430 contain the other unit, and whether it is within visual range. Block 724 reads the skill level of that particular other unit. The human player can set the skill levels of each AI unit individually, and can thus fight against a mix of enemies (and with a mix of friendlies), rather than merely playing others having a single uniform ability. The added realism for this feature is to force a player to guess whether any particular enemy lined up for a chancy shot is better or worse than the player, and might even turn the tables. Step 725 reads a probability from a table such as Table II corresponding to the sector and skill level of that other unit. Step 726 calibrates and slightly randomizes the table probability to reduce predictability, as discussed previously. Blocks 727–729 implement the concept of target fixation. If block 727 determines that the subject AI unit has already designated the other unit under consideration from block 722 as a target, then block 728 increases the table probability by a fixed amount. If the subject AI has not designated any target at all, the table probability remains unchanged. If it has designated a target but the unit under consideration is not the target, block 729 decreases the table probability by a fixed amount. These amounts can differ from each other, and they may vary with other factors, if desired.

Blocks 740 maintain the unit sight list 311 of an AI unit. Step 741 rolls a random number and compares it with the sighting probability to determine whether or not the other unit under consideration was sighted during the current sighting interval. If so, block 742 asks whether this unit is already on the unit sight list. If it is a newly sighted unit, block 743 adds a new entry to the unit sight list, and places in it an identification of the unit. Block 744 places a timestamp in the entry denoting when they were sighted. If the current unit is already on the sight list, block 744 updates the timestamp in its entry. Units added to a sight list 311 get to stay there for 24 seconds even if they are not detected in subsequent sighting cycles. If block 745 sees that the current unit is on the sight list and that its 24-second sighting period has expired, block 746 drops its entry. Control then returns to block 722 for consideration of the next unit on global unit list 301.

Once during every think interval activated at block 714, blocks 750 precompute a number of parameters relating to the units in every unit's sight list 311. For every AI unit operator 300, block 751 cycles through all the entries in the sight list for one of the AI units. Block 752 calculates the values of all the pertinent parameters, such as relative angle, heading, distance, etc., for that unit. Block 753 stores these values in the unit sight-list entry for that unit. The entry thus acts as a cache from which other blocks can access certain parameter values without having to recalculate them. Although these values are updated at the think rate, it is possible to precompute them at another rate, such as the list update rate, or to base this task upon some other factor, such as a situational complexity measure.

Block 754 calculates the target score for the sight-listed unit under consideration, as described previously. Again, other embodiments of the invention may calculate scores for other purposes; the broad purpose of the scoring process is to determine the measure of attention that a computer-controlled AI unit should devote to each of a number of other units in the simulation, to determine which other unit or units it should react to at the moment, based upon one or more criteria. Block 755 stores the score in the unit's entry in list 311. To increase realism by reducing predictability, block 755 can also randomize the score within a small range.

After block 751 has looped through all the AI units, blocks 760 select another unit to which it reacts. Although this unit is called a target, the best strategy could be to run away rather than to try to shoot it down. Also, it might be desired to consider friendly units as well, for collision avoidance or other purposes. Block 761 finds the identity of the opposing unit having the best target score. Compound decision block 762 accepts or rejects the candidate target. If the subject AI unit has no presently designated target, and if the best score falls below a minimum-interest threshold, then no action is taken. If the score does exceed the interest threshold, then block 763 designates that unit as the target. If there is a present target, but all scores have fallen below the interest threshold, block 764 drops it. If the present target has an acceptable score, block 765 determines whether or not a more appealing target has wandered into the field. If the highest score exceeds the score of the present target by a sufficiently high retargeting margin, block 766 redesignates the target; that is, it drops the old target and replaces its identity in the sight list with that of the new target unit.

Blocks 770 cause the currently running AI operator 300 to react to the selected target unit during the think interval. Block 771 determines which of the tactical configurations 500 exists for the current AI unit and its designated target. Step 772 selects a strategy from Table III for the current configuration. If no current target exists, step 772 chooses "disengage" as the strategy. If there multiple potential strategies for the configuration, block 772 selects among them randomly or as described above. It is important to note that the strategy for every AI is reevaluated during every think interval, so that the AI can change strategies rapidly for changing circumstances. This also allows less complex strategies to be strung together into more complex goals. Block 773 formulates a specific plan in response to the strategy selection. That is, blocks 771–773 determine a particular course of action for the current AI unit.

Block 774 selects the think time for the next cycle 700, in response to the strategy selection in block 772. If the strategy selected in block 772 is a tail-attack mode, then block 776 adds the body-rate (BPR) command to the group of available guidance commands for that AI unit.

Block 777 generates guidance commands for executing the plan. These are straightforward, except for the BPR unit; more detailed steps for this control are set out below, after the description of method 700.

Blocks 780 convert guidance commands into control settings appropriate for the simulated unit, such as aileron, elevator, and rudder positions. Blocks 780 and 790 in this embodiment are executed at the frame rate, rather than at the slower think rate. That is, although high-level guidance commands might be issued less frequently, the control surfaces of an AI unit change position at the higher frame rate in order to provide smoother, more realistic action. FIG. 3 shows the actual timing of AI operator functions. The position of these blocks in FIG. 7 shows the logical flow of the guidance process, rather than its temporal flow.

Block 781 chooses the controls for executing the guidance commands. In general, elevators control pitch and ailerons control bank and heading. But, as described earlier, elevators can control turn rate in a steep bank, and rudder and ailerons can control pitch. Block 782 cycles through the control surfaces affected by the current guidance commands. Block 783 generates a specific setting for the current control in response. Block 784 adjusts the position of the control surface in response to the setting; PID controllers 351–354 may implement this step. A position commonly has the form of a number, such as "set elevators to +248," that can be fed directly into the simulator.

Blocks 790 modify control settings from block 784 according to the modification techniques discussed in connection with block 360, FIG. 3. Because some of these employ rates of change or other historical data, block 791 stores previous control settings. In this case, only one previous cycle's settings need be kept. Block 792 cycles through each of the implemented modification techniques. Each control may have more than one modification. Block 793 tests the activation conditions for the current modification, and returns to 792 if they fail. If the conditions are met, block 794 applies the modification method, possibly using data from block 791. Block 795 outputs the control settings to the simulator, which reacts to them at the following frame time.

Finally, control returns from block 795 to block 711 for the next loop through cycle 700.

Figure 6:
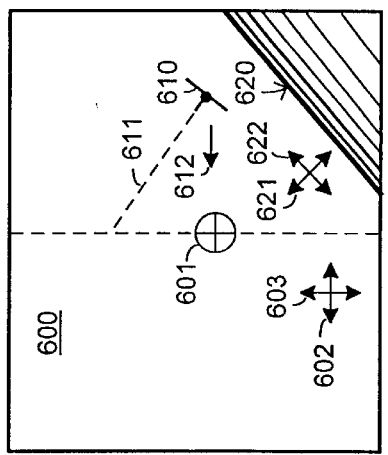
FIG. 6 illustrates control by body pitch axis according to the invention.

As mentioned above, the generation of BPR guidance commands is more complex than the others. Referring to FIG. 6, define a "body angle off nose" (BAON) as the angle formed between the opponent 610 and center point 601 in the AI unit's horizontal direction 602, and a "body angle of elevation" (BAOE) as the angle formed between opponent 610 and point 601 in the AI's vertical direction 603. The goal of the BPR guidance commands is to reduce both of these quantities to zero.

The first step is to choose a lead point to aim at. The lead point gets the attacking AI unit's nose a little bit ahead of the opponent so that a shot fired at the lead point will actually hit the opponent. It also allows the attacker to intercept more ably because it heads toward where the opponent will be, not where it is now. The lead point is determined as follows: (1) Calculate how long it would take the attacker to intercept the opponent if the opponent continued on its present course. (2) Divide that intercept time by ten as a lead time. (3) Extrapolate the opponent's current position, heading and speed by the lead time. This lead point is the extrapolated target position.

The next step is to project the AI unit's position forward in time by the same amount, i.e., the lead time. This is the extrapolated unit position.

Next is to calculate the BAON and BAOE between the extrapolated target position and the extrapolated unit position. This is a projected value of what the BAON and BAOE metrics will be; these values are an extrapolated BAON and an extrapolated BAOE. Dividing these extrapolated angles by the lead time yields their actual change rates.

Taking as much time as possible to line up allows gentler control motions. Minimum rates of change for the BAON and BAOE angles depends upon the distance between the attacking AI and the opponent, and this depends upon time to close. Therefore, minimum change rates of BAON and BAOE are the actual BAON and BAOE angles divided by the lead time. Subtracting the actual change rates from the desired change rates gives change-rate error values for both angles.

To correct for these errors: (1) Issue a bank guidance command to make the AI unit bank towards its target; that is, roll so that target 610 rotates to fall on vertical centerline 604. The bank amount is determined by projecting the AI-unit relative position into two dimensions and taking an arctangent. (2) Issue a BPR command to make the attacking AI unit's nose move up or down, in its own reference frame 602–603, at the appropriate velocity to make the opponent move along centerline 604 until the BAOE becomes zero. The appropriate body pitch velocity is −1 times the BAOE rate change error. That is, the AI unit requests a control-surface change to bring the elevation angle rate change to the desired value.

Conclusion

The above description embraces a number of variations on the basic concept of enhancing the realistic simulation of objects that interact with each other in complex ways, including those that are intended to appear human. Those skilled in the art will easily apprehend other variations and extensions within the described framework, as well as other areas of application of the principles described herein.

What is claimed is:

1. A method for simulating a subject computer-controlled unit in a simulated environment having at least one other unit within the environment, the method comprising:
   periodically determining a tactical condition relating to the subject unit; updating a first portion of the simulation at a first rate;
   updating a second portion of the simulation at a second rate; and varying the second rate in response to changes in the tactical condition.

2. A computer-usable medium carrying instructions and data for causing a programmable digital computer to execute the method of claim 1.

3. The method of claim 1, wherein the tactical condition is determined with reference to the one other unit.

4. The method of claim 3, further comprising selecting a strategy for the subject unit, and wherein the tactical condition is responsive to the selected strategy.

5. The method of claim 3, wherein the tactical condition is responsive to a spatial configuration of the subject unit and the other unit in the simulated region.

6. The method of claim 5, wherein the spatial configuration includes the relative bearing between the subject unit and the other unit.

7. The method of claim 5, wherein the spatial configuration includes the relative headings of the subject unit and the other unit.

8. The method of claim 1, wherein the first portion of the simulation includes calculating spatial positions of the subject unit.

9. The method of claim 8, wherein the first portion of the simulation includes calculating spatial positions of the other unit.

10. The method of claim 1, wherein the second portion of the simulation includes determining whether to select the other unit as an object of attention.

11. The method of claim 1, wherein the second portion of the simulation includes determining a strategy for the subject unit to execute.

12. The method of claim 1, wherein the second portion of the simulation includes issuing guidance commands for directing the subject unit in the simulated environment.

13. A method for performing a simulation of multiple computer-controlled units in a simulated environment, the method comprising:
   updating a first portion of the simulation of all of the units at a first rate;
   updating a second portion of the simulation of each of the units at one of a plurality of different second rates; and
   selecting one of the second rates for each of the units independently of the second rates of the other units.

14. A computer-usable medium carrying instructions and data for causing a programmable digital computer to execute the method of claim 13.

15. The method of claim 13, wherein the first rate is constant.

16. The method of claim 13, wherein different ones of the computer-controlled units have different second rates simultaneously.

17. The method of claim 13 wherein the simulation further includes a player-controlled unit, further comprising updating the simulation of the player-controlled unit independently of the second rate.

18. The method of claim 13, further comprising determining a tactical condition relating to each of the computer-controlled units, and wherein the second rate for each of the units is responsive to the tactical condition.

19. The method of claim 18, wherein the tactical condition is determined separately for each of the computer-controlled units.

20. The method of claim 18, wherein the tactical condition is determined periodically.

21. The method of claim 20, wherein the tactical condition is determined at different rates for different ones of the computer-controlled units.

22. The method of claim 20, wherein the tactical condition for each of the computer-controlled units is determined at the respective second rate of each unit.

23. A simulator implemented on a programmed digital computer for controlling a subject unit in a simulated environment containing at least one other unit, the simulator comprising:
   a rate generator for producing one of a plurality of different rates;
   a guidance module for directing the subject unit and responsive to the rate generator for operating at one of the different rates; and
   a selector module for selecting among the different rates in response to a predetermined relationship between the subject unit and the other unit.

24. The simulator of claim 23, wherein the predetermined relationship is a spatial relationship between the subject unit and the other unit.

25. The simulator of claim 23, wherein the guidance module issues guidance commands for the subject unit.

26. The simulator of claim 23, further including a target module for selecting the other unit as an object of attention, the target module being responsive to the rate generator for operating at one of the different rates.

27. The simulator of claim 23, including a strategy module for determining a strategy with respect to the other unit, the strategy module being responsive to the rate generator for operating at one of the different rates.

28. The simulator of claim 27, wherein the strategy module includes the selector module.

29. The simulator of claim 23, for controlling a plurality of subject units, comprising:

separate rate generators for each of the subject units, each rate generator producing a plurality of rates independently of the remaining rate generators;

separate guidance modules for directing the subject units and responsive to respective ones of the rate generators;

separate selector modules for selecting among the different rates independently of the remaining selector modules.

30. The simulator of claim 29, wherein different ones of the rate generators operate at different ones of the rates simultaneously.

31. A programmed computer, comprising:

input devices for accepting a sequence of commands from a user for directing a simulated player unit;

a plurality of controllers each controlling one of a plurality of subject units, each controller including a rate generator for producing one of a plurality of different rates, a guidance module for directing the subject unit and responsive to the rate generator for operating at one of the different rates, and a selector module for selecting among the different rates in response to a predetermined relationship between the subject unit and the other unit;

a simulator responsive to the guidance commands for simulating the units in an environment;

a rendering module responsive to the simulator for calculating representations of the units; and output devices responsive to the rendering module for displaying the representations.

32. The computer of claim 31, further comprising a set of storage devices.

33. The computer of claim 32, wherein the storage devices hold model data concerning the units.

34. The computer of claim 32, wherein the storage devices hold terrain data representing the simulated environment.

35. The computer of claim 31, wherein the simulator includes a physics engine for simulating at least one of the units.

36. The computer of claim 35, wherein the physics engine simulates both the player unit and at least one of the subject units.

* * * * *